(12) United States Patent
Houston

(10) Patent No.: US 6,225,175 B1
(45) Date of Patent: *May 1, 2001

(54) PROCESS FOR DEFINING ULTRA-THIN GEOMETRIES

(75) Inventor: Theodore W. Houston, Richardson, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/098,188

(22) Filed: Jun. 16, 1998

Related U.S. Application Data

(60) Provisional application No. 60/050,979, filed on Jun. 20, 1997.

(51) Int. Cl.$^7$ .................... H01L 21/336; H01L 21/3205
(52) U.S. Cl. .................... 438/305; 438/301; 438/303; 438/304; 438/585; 438/692; 438/947
(58) Field of Search .................... 438/301, 303, 304, 305, 692, 585, 947

(56) References Cited

U.S. PATENT DOCUMENTS 5,846,857 * 12/1998 Ju .................... 438/199

OTHER PUBLICATIONS

Dudek et al, Lithography–Independent Nanometer Silicon MOSFET on Insulator, IEEE. No month 1996.*
"An Ultra Low Power Lateral Bipolar Polysilicon Emitter Technology on SOI", Dekker et al., 1999 IEEE, pp 75–77, no month 1993.
"Lithography–Independent Namoneter Silocon MOSFET's on Insulator", Dudek et al., vol. 43. No. 10, Oct. 1996, pp. 1626–1631.
"A Novel High–Performance Lateral Bipolar on SOI", Shahidi et al., 1991 IEEE, pp 663–666, no month.

* cited by examiner

*Primary Examiner*—John F. Niebling
*Assistant Examiner*—Alexander G. Ghyka
(74) *Attorney, Agent, or Firm*—Wade James Brady, III; Frederick J. Telecky, Jr.

(57) ABSTRACT

A method of fabricating a semiconductor device wherein a first material is provided on a first surface which has a surface and a sidewall. A sidewall structure of predetermined thickness, extending away from the sidewall, is formed with a second material different from the first material. The sidewall structure can be formed on a pair of adjacent sidewalls, the sidewall structure filling the space between the sidewall pair. Optionally, portions of the sidewall structure are removed and a second sidewall deposition of the same or different thickness can be added on exposed portions of the sidewall and the sidewall structure, thereby providing a disposition of different sidewall structure thickness. Additional portions of the sidewall structure can be removed. A third material different from the second material is formed covering exposed portions of the first surface, sidewall structure and first material. The first and third materials can be the same. The third material is planarized to expose surfaces of the first material and the sidewall structure, these surfaces and the surface of the third material being substantially coplanar. Optionally, the sidewall structure is removed, forming an aperture between the first material and the third material. A contact can be formed in the aperture (e.g. to a source/drain region insulated from a gate) by filling it with a conductive material.

27 Claims, 7 Drawing Sheets

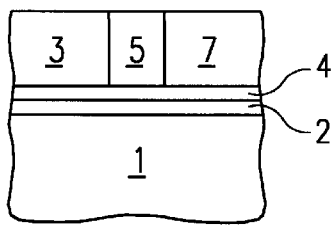
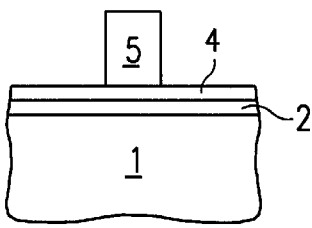
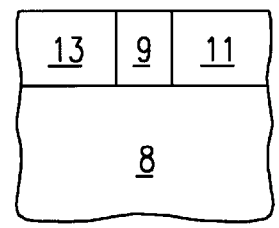
FIG. 1a　　　　FIG. 1b　　　　FIG. 1c
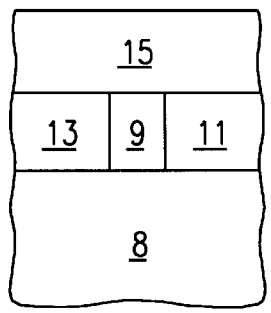
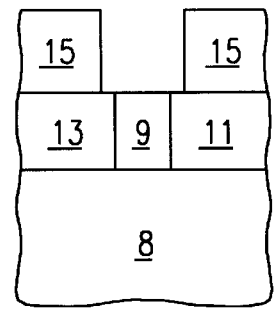
FIG. 1d　　　　FIG. 1e
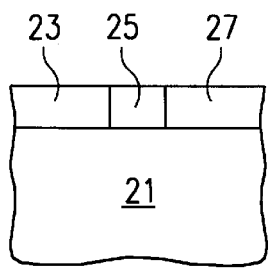
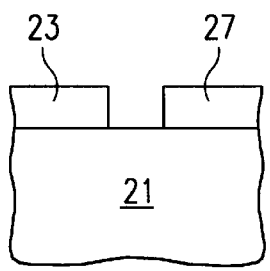
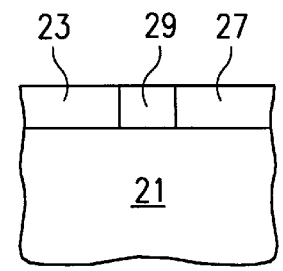
FIG. 2a　　　　FIG. 2b　　　　FIG. 2c

PROCESS FOR DEFINING ULTRA-THIN GEOMETRIES

CROSS REFERENCE TO PRIOR APPLICATIONS

This application claims priority under 35 USC 119(e)(1) of provisional application No. 60/050,979 filed Jun. 20, 1997.

BACKGROUND OF THE INVENTION

1. Field of the Invention

This invention relates to procedures for accurately defining very small geometries, on the order of down to about 50 angstroms, in the fabrication of semiconductor devices.

2. Brief Description of the Prior Art

As the geometries of semiconductor devices become increasingly smaller, photolithographic techniques are becoming increasingly less capable of coping with the requirement to accurately define the geometry of gate lengths and contact openings in the fabrication of such devices. This problem is particularly acute when viewed from an economic perspective. Accordingly, there is a continuing effort in the art of semiconductor fabrication to resolve this problem and the present invention is a continuation of this effort.

It is known that the geometries of sidewall depositions can be very closely controlled on an economic basis in view of the fact that the sidewall thicknesses can be very well controlled down to thicknesses in the tens of angstroms. The formation and use of sidewall oxides in particular have been well known in the art for many years. It is also known in the prior art to use sidewall spacers on the gates of MOSFETs to separate the source/drain implant from the channel region and to separate the source/drain silicide from the gate silicide. It is further known to use sidewall layers to form narrow gate structures.

SUMMARY OF THE INVENTION

In accordance with the present invention, there is provided a procedure for accurately and repeatedly providing ultra-thin component geometries which can be as thin as about 50 angstroms and which can optionally also provide self alignment to another feature of the device being fabricated using the known properties and control of sidewalls, both in the form of permanent materials as well as materials intended to be removed during processing.

The fabrication of semiconductor devices is accomplished in accordance with the present invention using the properties of sidewall depositions as known in the prior art. Briefly, a sidewall disposition is formed which may or may not be a permanent part of the final device. The material from which the sidewall is formed can be any material which is capable of being removed selective to material which surrounds or will surround the sidewall either entirely or in part, which is substantially inert to other fabrication steps as long as it is present and which is sufficiently rigid to operate as a mask and/or as a permanent part of the final device being fabricated. The sidewall is formed to the desired thickness, such formation being capable of accuracy to within about 0.1 nanometer and down to thicknesses of about 50 angstroms. A material other than that of the sidewall is then deposited adjacent the sidewall and the surface against which the sidewall is disposed, the sidewall and the newly deposited material are planarized, such as by chemical-mechanical polishing (CMP) to expose the top of the sidewall layer for subsequent processing (e.g., siliciding or making contact thereto). Subsequently, either the remaining sidewall or the material surrounding the remaining sidewall may be removed by use of an etchant or etchants selective to either the sidewall material or the material surrounding the sidewall material. The end result is either an aperture or slot where the sidewall was formed, the free-standing sidewall or the sidewall and surrounding material with coplanar outer surfaces. In either case, the dimensions of the aperture or sidewall are accurately controlled down to dimensions less than 0.1 nanometer and generally down to about 50 angstroms.

BRIEF DESCRIPTION OF THE DRAWINGS

FIGS. 1a and 1b represent a process flow for formation of an MOS transistor in accordance with the present invention;

FIGS. 1c to 1e show a technique for fabrication of a self-aligned contact to a sidewall structure in accordance with the present invention;

FIGS. 2a to 2c represent a process flow for formation of a contact opening in accordance with the present invention;

DESCRIPTION OF THE PREFERRED EMBODIMENT

Figures 3A, 3B, 3C:
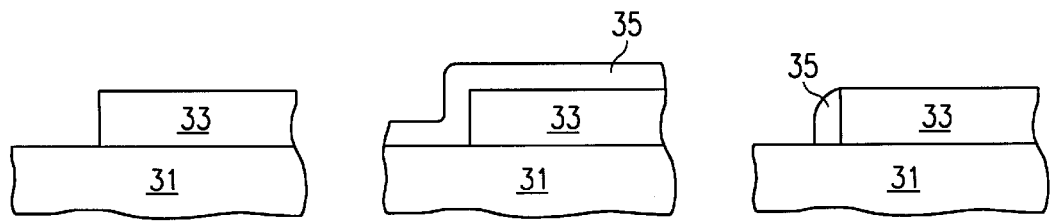
FIGS. 3a to 3e is a process flow in accordance with a second embodiment of the invention.

Referring to FIGS. 1a and 1b, there is shown a technique for fabrication of an MOS device in accordance with the present invention. Referring first to FIG. 1a, there is shown a substrate 1 of silicon semiconductor material onto which has been formed a gate oxide 2, and a first gate material, such as TiN 4. A second material 3, such as a silicon oxide, has been deposited on the first gate material 4 and patterned to form a sidewall. A second gate material 5, such as polysilicon, is formed as a sidewall layer on the sidewall of the silicon oxide 3 by deposition and anisotropic etch. Due to the slight anisotropicity of isotropic etchants, the thickness of the sidewall 5 is determined primarily by the thickness of the deposited second gate material 5. Unwanted portions of the second gate material 5 are removed with a pattern and etch sequence. Additional material 7, such as a silicon oxide, is deposited and planarized using a chemical-mechanical polish (CMP) to expose a surface of the second gate material 5, as shown in FIG. 1a. The exposed surface of second gate material 5 is optionally silicided. The oxide regions 3 and 7 are removed with an etchant that is selective to the oxide relative to the polysilicon and silicide, leaving the gate stack as shown in FIG. 1b. Standard processing is then used to complete formation of the device. It should be apparent to those skilled in the art that various materials and gate stack can be substituted in the above. Further, the sequence of forming a sidewall, depositing a temporary material and planarizing to expose a planar surface of the sidewall may be applied to other structures. The term "substrate" as used herein is meant to define any surface on which a structural portion of semiconductor devices can be fabricated.

Referring to FIGS. 1c to 1e, there is shown a technique for fabrication of a self-aligned contact to a sidewall structure in accordance with the present invention. Similar to FIG. 1a, FIG. 1c shows a substrate 8 on which a sidewall structure 9 is formed on the sidewall of material 11 in standard manner. Material 13 is deposited and planarized using CMP to provide the structure of FIG. 1c. Referring to FIG. 1d, material 15 is deposited on the outer surface of the sidewall structure 9 and its surrounding materials 11 and 13. Material 15 is chosen to be selectively etchable relative to materials 9, 11 and 13. For example, an oxide is a suitable choice for material 15 if material 9 is titanium silicide and materials 11 and 13 are nitrides. Material 15 is patterned and etched with an etch selective to material 15 relative to materials 9, 11 and 13 to provide the structure of FIG. 1e. It should be apparent to those skilled in the art that various materials can be substituted in the above. Further, the sequence of forming a sidewall, depositing an additional material and planarizing to expose a planar surface of the sidewall and subsequent deposition of a material with selective etch planarizing relative to the sidewall material and its surrounding materials may be applied to forming self-aligned contacts to other sidewall structures.

Referring to FIGS. 2a to 2c, there is shown a technique for fabrication of a contact opening in accordance with the present invention. Referring to FIG. 2a, there is shown a substrate 21 of silicon semiconductor material onto which has been patterned a region of first material 23 having a sidewall. A sidewall of a second material 25 is formed on the sidewall of the first material 23 by deposition with the desired sidewall thickness. The first material 23 and second material 25 are chosen such that the second material can be selectively etched relative to the first material. For example, oxide can be used for the first material 23 and polysilicon can be used for the second material 25. Unwanted portions of the sidewall 25 are removed with a pattern and etch sequence. A third material 27, preferably the same as the first material 23 is then conformally deposited over the entire device and the surface is planarized using a chemical-mechanical polish (CMP) to provide the structure as shown in FIG. 2a. The sidewall 25 is removed using an etchant which is selective to the sidewall relative to the first material 23 and the third material 27, leaving the regions 23 and 27 and the contact opening between those regions as shown in FIG. 2b. A contact material, for example, a tungsten silicide layer, is then conformally deposited over the device and etched back to leave a contact 29 within the contact region between the regions 23 and 27 as shown in FIG. 2c. It should be apparent to those skilled in the art that other materials can be substituted and that the sequence of forming a sidewall, depositing an additional material followed by planarization and removal of the sidewall material can be applied to other structures.

Figures 3D, 3E:
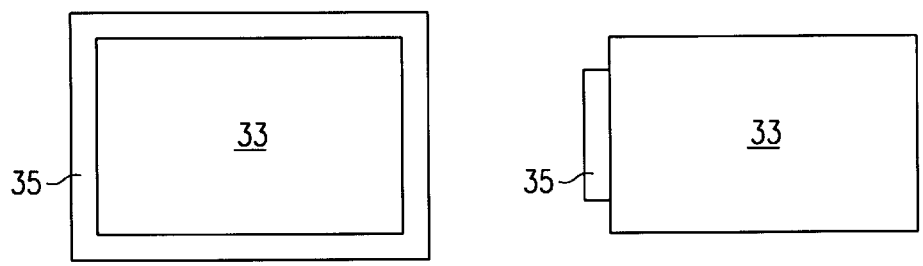

Referring now to FIGS. 3a to 3e, there is shown a process flow in accordance with a second embodiment of the invention. As can be seen with reference to FIG. 3a, there is provided an underlying material 31 on which has been deposited a second material 33 which has been patterned and etched. A third material 35 with etch properties different from those of the second material 33 is conformally deposited on the second material as shown in FIG. 3b and the third material is then isotropically etched with the etch stopping when it reaches the second material as shown in FIGS. 3c and 3d. This etch removes the third material 35 from the "horizontal" surfaces and leaves the third material on the "vertical" sidewall surfaces. The thickness of the remaining sidewall layer is determined primarly by the initial deposition of the third material 35 with the height of the sidewall layer being determined by the thickness of the second material. The structure is then patterned and etched, preferably isotropically, to remove the sidewall layer where it is not desired as shown in FIG. 3e.

A difficulty with using sidewall layer defined geometries is that all geometries formed with one sidewall layer deposition are of the same width. In order to obtain multiple widths, the following process flow can be used, still utilizing the techniques described hereinabove.

Figure 4:
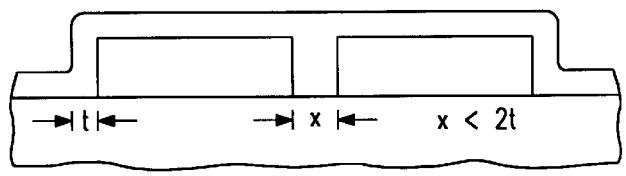
FIG. 4 is a side view showing formation of slots having a width determined by the number and thickness of sidewall depositions in accordance with the present invention.

With reference to FIG. 4, when initially forming the sidewall onto which the sidewall layer will be formed, slots are also formed with a width, x, of a slot less than twice the width, <2t, of the sidewall layer to be deposited. Then when the sidewall layer is deposited and the slot is then filled with the sidewall material, the width of the resulting structure is determined by the width of the slot rather than the thickness of the deposited sidewall layer. Different width slots can be used with the restriction that the slot be no wider than twice the deposited sidewall layer thickness.

Figures 5A, 5B:
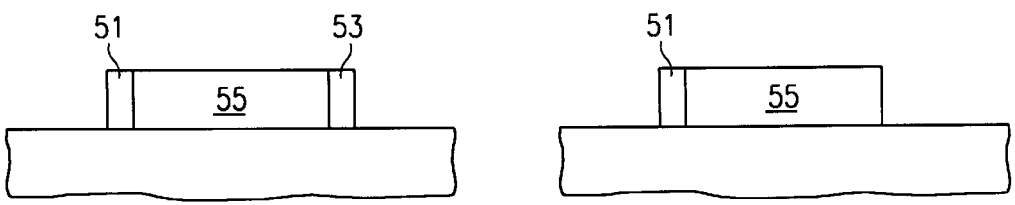
FIGS. 5a to 5c represent a process flow showing a combination of the above described process flows.
Figure 5C:
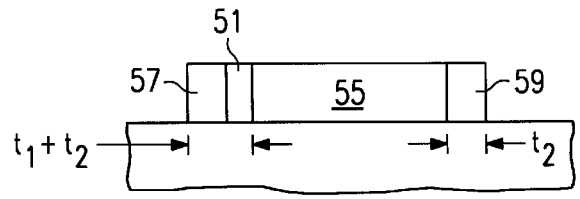

With reference to FIGS. 5a to 5c, the sidewalls 51 and 53 are formed on member 55 in standard manner as shown in FIG. 5a. The device is then patterned and isotropically etched to remove the sidewall 53 as shown in FIG. 5b. A further sidewall deposition provides a sidewall 51,57 having a thickness of $t_1+t_2$ and a sidewall 59 having a thickness $t_2$ as shown in FIG. 5c.

The embodiments described with reference to FIGS. 4 and 5a to 5c can be combined to obtain a spectrum of widths with the restriction that the width of a slot be less than twice the thickness of the sum of the depositions.

Figure 6A:
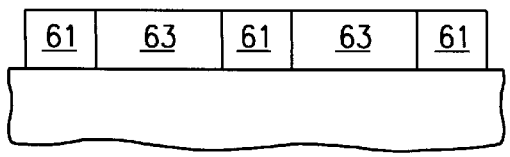
FIGS. 6a to 6c represent a process flow showing the use of the sidewall structure to mask processing of the underlying layer in accordance with the present invention.
Figure 6B:
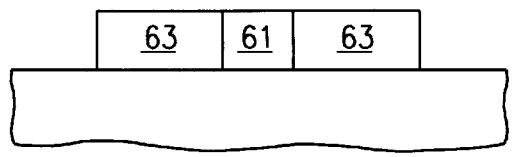
Figure 6C:
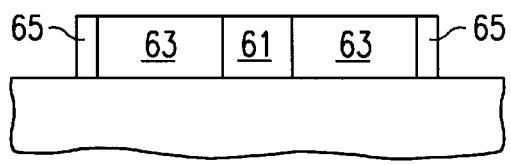

As shown in FIG. 6a, the first sidewall deposition on the structure 63 can be made relatively thick as at 61, allowing wide slots. The first deposition is then removed from edges that are to be used to form narrow width structures as shown in FIG. 6b. Then the second deposition 65 can be of the appropriate thickness for the narrow width structures as shown in FIG. 6c wherein the slot at 61 remains filled from the first deposition.

Figure 7A:
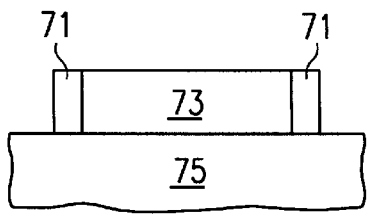
FIGS. 7a to 7c represent a process flow showing a second embodiment of the process flow of FIGS. 6a to 6c.
Figure 7B:
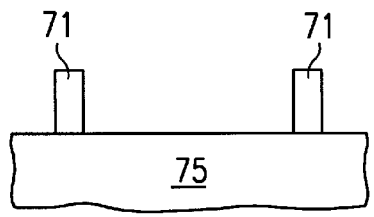
Figure 7C:
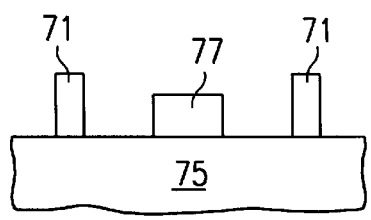
Figure 8A:
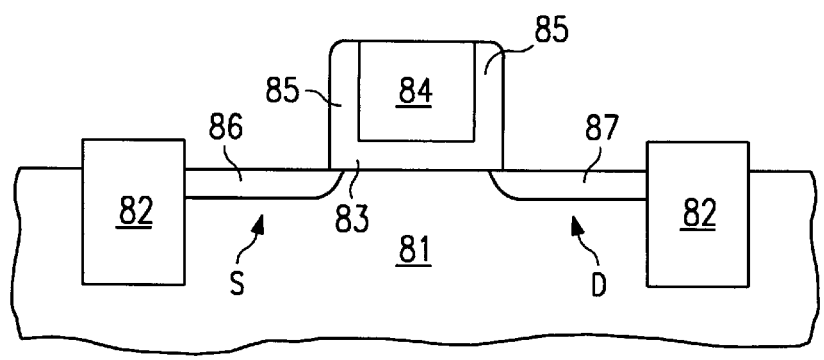
FIGS. 8a to 8g represent a process flow using the sidewall spacers for alignment in accordance with the present invention.
Figure 8B:
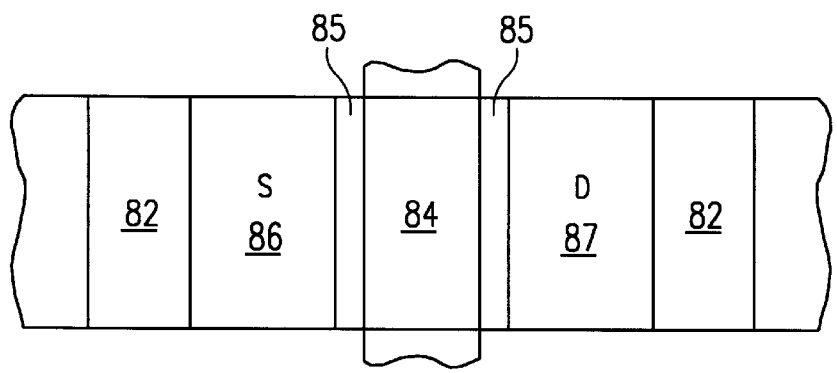
Figure 8C:
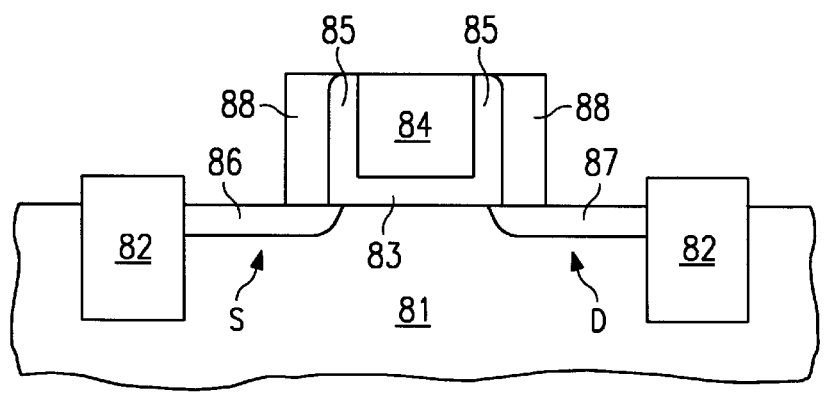
Figure 8D:
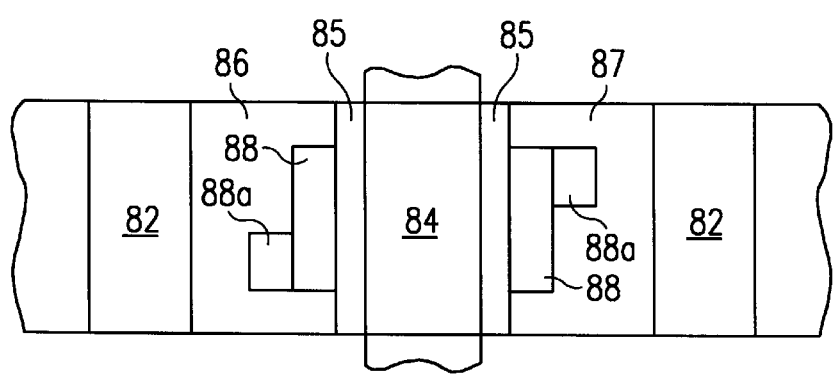
Figure 8E:
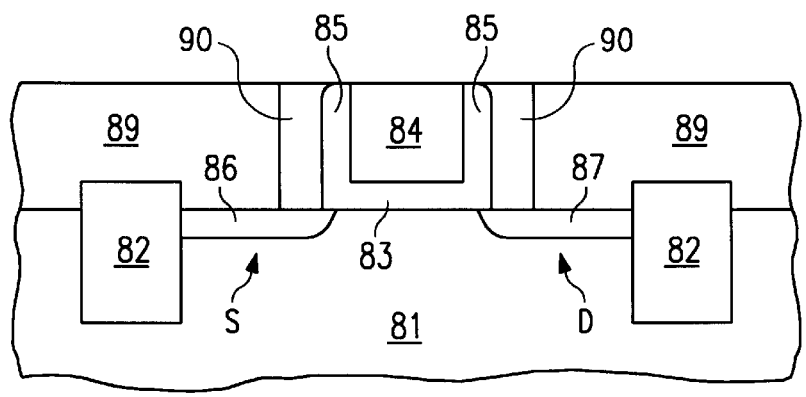
Figure 8F:
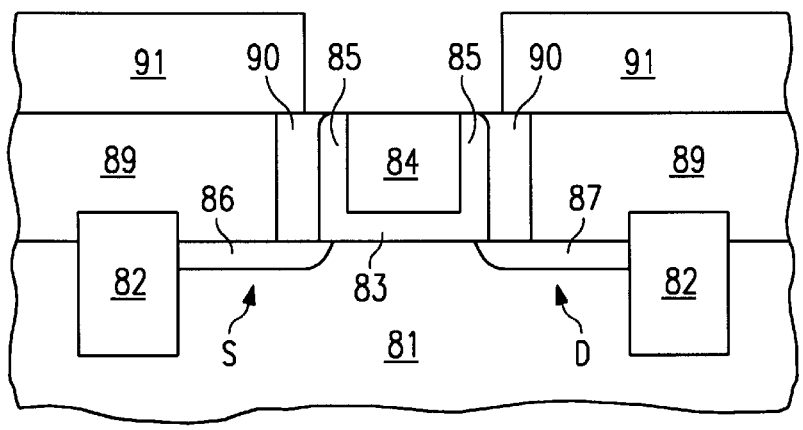
Figure 8G:
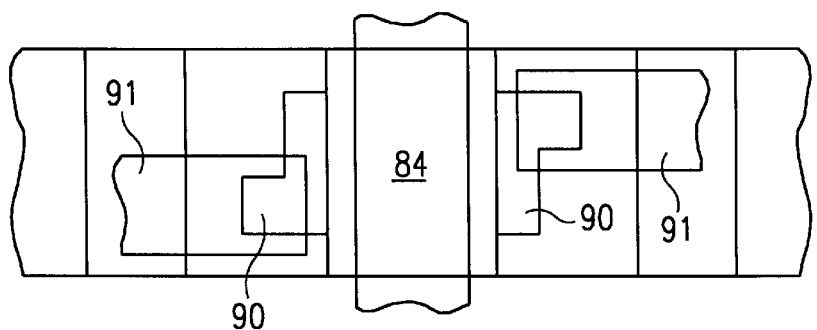

Referring now to FIGS. 7a to 7c, if the sidewall layer structures are to be used to mask processing of the underlying layer, then the sidewall pattern can be combined with a resist pattern. With reference to FIG. 7a, sidewalls 71, for example, nitride sidewalls, are formed on the exposed sides of a material 73, for example, polysilicon, which rests over a material to be processed 75, for example, an oxide. The material 73 is then removed by selective etch as shown in FIG. 7b. Unwanted portions of sidewall 71 are removed with a pattern and etch sequence. A resist 77 is then deposited and patterned over the material to be processed 75 and the material to be processed 75 is then processed, using the sidewalls 71 and the resist 77 as a mask as shown in FIG. 7c. Various materials with selective etch properties can be substituted in the above example. Also, other sequences can be used to combine a resist pattern with a sidewall structure to mask a subsequent etch. For example, the unwanted portions of the sidewall structure can be removed prior to removing material 73. As another example, referring to FIG. 7a, instead of removing material 73 prior to deposition of resist, additional material can be deposited and planarized, for example with CMP, and the resist pattern subsequently formed on the planarized surface. to FIGS. 8a to 8g , there is shown a further embodiment of the invention wherein the sidewall structure is used for alignment, such as, for example, aligning source/drain contacts to the gate structure in a MOSFET. Referring to FIGS. 8a and 8b, which are top and cross-sectional views of identical structure, there is provided a substrate 81 having shallow trench oxide isolation 82. A gate oxide 83 and gate electrode 84 are formed over the substrate 81 in standard manner and a sidewall oxide 85 is formed over the sidewalls of the gate electrode 84. Source and drain regions 86 and 87 are implanted in standard manner with the source and drain regions optionally being silicided in standard manner (not shown). A sidewall layer 88 is then formed on the sidewall oxide 85 by conformally depositing a further layer of, for example, doped polysilicon in the case of contact material and silicon nitride or silicon oxide in the case of a space holder and anisotropically etching this layer as shown in FIGS. 8c and 8d. Optionally, the sidewall layer 88 can be multiple layers such as 88a as shown in FIG. 8d to provide multiple contact widths. As shown in FIG. 8e, a layer of material 89, such as, for example, borosilicate glass, can be deposited over the entire structure and then planarized. If the sidewall layer 88 is not a contact material, then the sidewall layer 88 can be removed by forming the sidewall layer 88 with a material that can be removed to the exclusion of the sidewall oxide 85 to leave an aperture extending to the source and drain regions 86 and 87. Conductive material 90 is then deposited in the aperture extending to the source and drain regions 86 and 87. Interconnects 91 are then formed over the layer 89 and contacting the conductive material 90 as shown in FIGS. 8f and 8g.

Figure 9A:
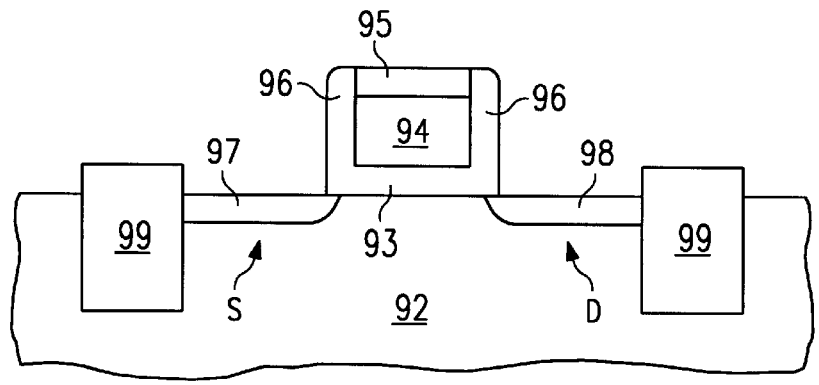
FIGS. 9a to 9f represent a second embodiment of a process flow similar to that of FIGS. 8a to 8g.
Figure 9B:
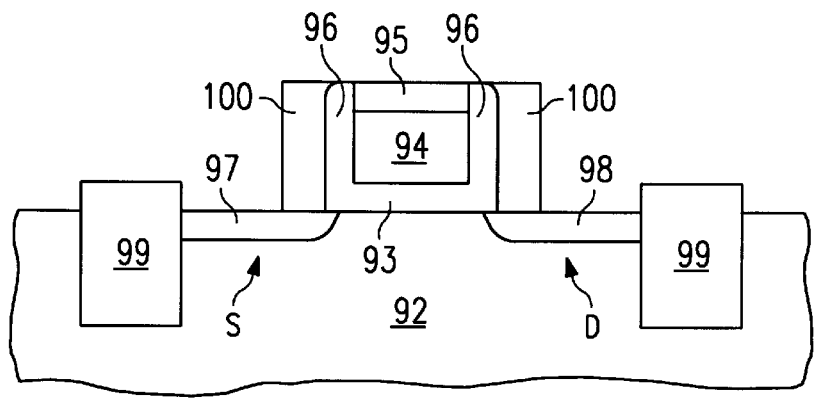
Figure 9C:
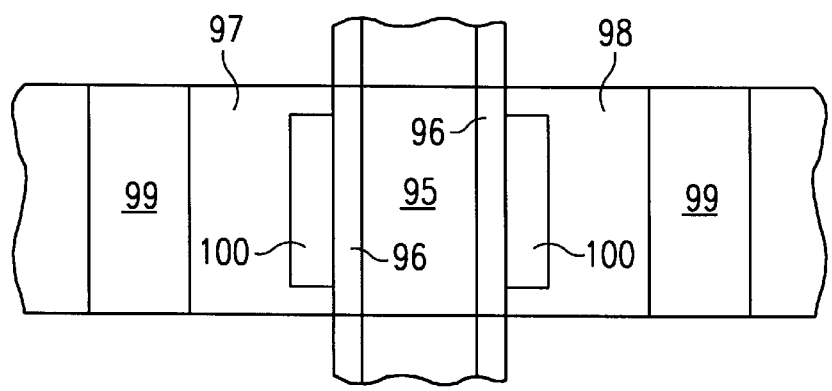
Figure 9D:
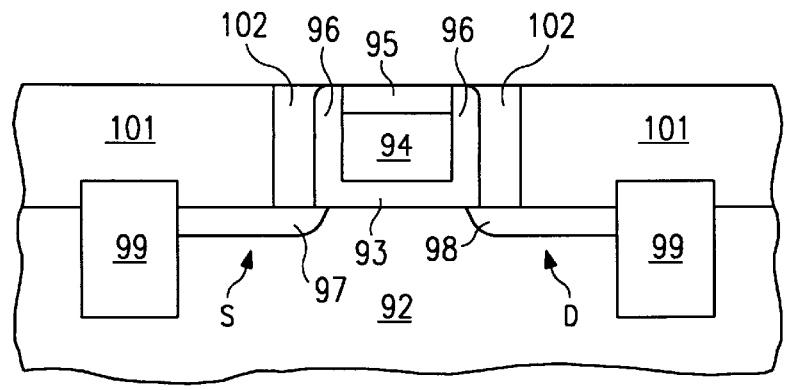
Figure 9E:
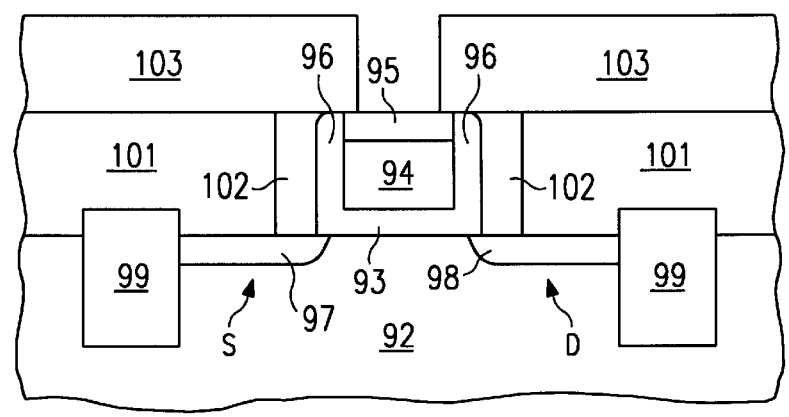
Figure 9F:
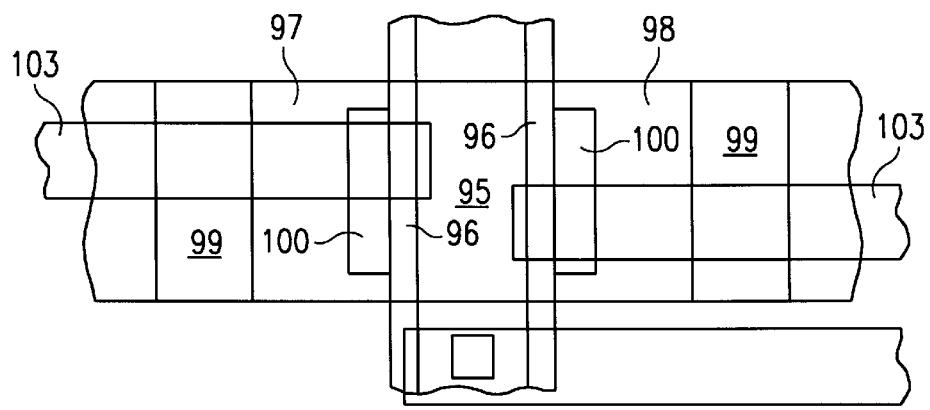

Referring now to FIGS. 9a to 9f, there is shown a still further embodiment in accordance with the present invention of using a sidewall structure for alignment. In this embodiment, the source/drain contacts are self-aligned to the gate structure with a dielectric present over the gate. This is provided by providing a substrate 92 having a shallow trench implant 99 to provide the moat structure, forming a gate oxide 93 thereon with gate material 94 and a cap oxide 95 thereover. The gate structure including oxide 93, material 94 and cap oxide 95 is patterned and etched and sidewall spacers 96 are added onto the sidewall of the gate structure. Source and drain implants 97 and 98 are then provide in standard manner using the sidewall spacer 96 as shown in FIG. 9a. A sidewall layer 100 is then formed on the sidewall oxide 96 by conformally depositing a further layer of, for example, doped polysilicon in the case of contact material and silicon nitride or silicon oxide in the case of a space holder and anisotropically etching this layer as shown in FIGS. 9b and 9c. Optionally, the sidewall layer 100 can be multiple layers such as 88a as shown in FIG. 8d to provide multiple contact widths. As shown in FIG. 9d, a layer of material 101, such as, for example, borosilicate glass, can be deposited over the entire structure and then planarized. If the sidewall layer 100 is not a contact material, then the sidewall layer 100 can be removed by forming the sidewall layer 100 with a material that can be removed to the exclusion of the sidewall oxide 96 to leave an aperture extending to the source and drain regions 97 and 98. Conductive material 102 is then deposited in the aperture extending to the source and drain regions 97 and 98. Interconnects 103 are then formed over the layer 101 and contacting the conductive material 102 as shown in FIGS. 9e and 9f.

Though the invention has been described with reference to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A method of fabricating an integrated circuit which comprises the steps of:
    (a) providing a sidewall structure of a first material on the sidewall of a second material, said first and second materials being selectively etchable relative to each other;
    (b) patterning and etching said first material selective to said second material;
    (c) covering said first and second materials with a third material extending over the sidewall of said first material and planarizing said third material to partially remove a portion of said third material to expose a surface of said sidewall structure of said first material which surface is substantially planar with a surface of said second material and said third material; and
    (d) removing either said first material or said second material and said third material.

2. The method of claim 1 wherein said step of removing is removal of only said first material.

3. The method of claim 1 wherein said step of removing is removal of only said second and third materials.

4. The method of claim 1 wherein said step of partial removal of said third material includes the step of providing a chemical-mechanical polish.

5. The method of claim 2 further including the step of depositing a fourth electrically conductive material in the space from which said first material was removed and depositing a fifth electrically conductive material on the surface of said electrical conductor contacting said fourth material.

6. A method of fabricating an integrated circuit comprising the steps of:
    (a) providing a first material having a sidewall;
    (b) forming a first sidewall structure on said sidewall by a plurality of separate depositions;
    (c) etching said first material to form a plurality of sidewalls including said sidewall, the outer surfaces of a subset of said sidewalls being spaced apart by a distance x: and
    (d) depositing a material for formation of said first sidewall structure between said subset of sidewalls, said material being thicker than x/2.

7. The method of claim 6 wherein at least one of said separate depositions is of a thickness different from other of said depositions.

8. The method of claim 6, further including the steps of:
    (e) forming at least one additional sidewall on said first material;
    (f) selectively removing portions of said first sidewall structure; and
    (g) forming a second sidewall structure on an outer surface of said first sidewall structure and on the exposed portion of said at least one additional sidewall.

9. The method of claim 7, further including the steps of:
    (e) forming at least one additional sidewall on said first material;
    (f) selectively removing portions of said first sidewall structure; and
    (g) forming a second sidewall structure on an outer surface of said first sidewall structure and on the exposed portion of said at least one additional sidewall.

10. A method of fabricating a semiconductor device which comprises the steps of:
  (a) providing a first material having a surface and a first sidewall;
  (b) forming a second sidewall structure on said first sidewall with a second material having a determined thickness by depositing and then performing an anisotropic etch of said second material selectively etchable to said first material;
  (c) disposing a third material different from said second material against said second material having a surface coplanar with said surface of said first material; and
  (d) removing a portion of said third material to expose an outer surface of said second material essentially planar with the outer surfaces of said second material and said first material.

11. The method of claim 10 wherein said first material and said third material are the same.

12. The method of claim 10 wherein at least one of said first material and said third material is a resist.

13. The method of claim 10 wherein said second material is a resist.

14. The method of claim 11 wherein said second material is a resist.

15. The method of claim 10 wherein said second material is taken from the group consisting of silicon oxide and silicon nitride.

16. The method of claim 11 wherein said second material is taken from the group consisting of silicon oxide and silicon nitride.

17. The method of claim 12 wherein said second material is taken from the group consisting of silicon oxide and silicon nitride.

18. The method of claim 10 wherein at least one of said first material and said third material is taken from the class consisting of silicon oxide and silicon nitride.

19. The method of claim 11 wherein at least one of said first material and said third material is taken from the class consisting of silicon oxide and silicon nitride.

20. The method of claim 13 wherein at least one of said first material and said third material is taken from the class consisting of silicon oxide and silicon nitride.

21. The method of claim 14 wherein at least one of said first material and said third material is taken from the class consisting of silicon oxide and silicon nitride.

22. A method of fabricating a semiconductor device which comprises the steps of:
  (a) providing a substrate;
  (b) providing a first material having a surface and a sidewall disposed over said substrate;
  (c) disposing a second material different from said first material on and covering said sidewall and extending to said substrate;
  (d) disposing a third material different from said second material on and covering said second material;
  (e) removing a portion of said third material to expose a portion of said second material while leaving a sidewall of said third material over said second material;
  (f) removing said second material to provide an aperture extending to said substrate; and
  (g) disposing an electrically conductive material extending to said substrate in said aperture.

23. The method of claim 22 wherein said substrate is a semiconductor substrate having source and drain regions disposed therein and said first material is a gate region disposed between said source and drain regions and electrically insulated from said substrate, further including the step of disposing an electrically conductive material into said aperture extending to one of said source and drain regions.

24. A method of fabricating a semiconductor device which comprises the steps of:
  (a) providing a first material having a surface and a pair of sidewalls;
  (b) disposing a second material different from said first material and of first controlled width on said pair of sidewalls;
  (c) removing said second material from one of, said sidewalls to expose said one of said sidewalls; and
  (d) disposing a third material on said remaining second material and the exposed one of said sidewalls of second controlled width.

25. The method of claim 24 wherein said second material and said third material are the same.

26. The method of claim 24 wherein said second controlled width is different from said first controlled width.

27. The method of claim 25 wherein said second controlled width is different from said first controlled width.

* * * * *